United States Patent [19]
Rostoker et al.

[11] Patent Number: 5,478,698
[45] Date of Patent: Dec. 26, 1995

[54] DIRECT-WRITE AFOCAL ELECTRON-BEAM SEMICONDUCTOR LITHOGRAPHY

[75] Inventors: Michael D. Rostoker, San Jose; Nicholas F. Pasch, Pacifica; Joe Zelayeta, Saratoga, all of Calif.

[73] Assignee: LSI Logic Corporation, Milpitas, Calif.

[21] Appl. No.: 105,261

[22] Filed: Aug. 12, 1993

[51] Int. Cl.$^6$ ............................... G03F 7/20; H01J 37/30
[52] U.S. Cl. .......................... 430/296; 430/311; 430/942; 250/492.2; 250/492.3
[58] Field of Search ..................... 430/296, 311, 430/942; 250/492.1, 492.2, 492.3

[56] References Cited

U.S. PATENT DOCUMENTS 4,785,189  11/1988  Wells ........................... 250/492.2
5,055,871  10/1991  Pasch ........................... 355/53

Primary Examiner—Kathleen Duda

[57] ABSTRACT

A technique is describe for effecting very-high resolution semiconductor lithography using direct-write afocal electron-beam exposure of a sensitized wafer. A positioning mechanism and needle-like probe similar to those used in scanning-tunneling microscopy are used in conjunction with a controllable electron field emission source to produce a near-field electron beam capable of exposing an electron-beam sensitive resist on a wafer surface. Conventional e-beam resists are used. The technique can be used in conjunction with scanning-tunneling-like operation of the apparatus to record the appearance and nature of the wafer surface, thereby providing information about the location of underlying features. This location information can be used to assist in aligning the exposure patterns to existing structures in the semiconductor wafer. A multi-probe embodiment with separately controllable field emission sources provides for improved productivity by permitting contemporaneous exposure of multiple sites on a single wafer.

10 Claims, 2 Drawing Sheets

DIRECT-WRITE AFOCAL ELECTRON-BEAM SEMICONDUCTOR LITHOGRAPHY

TECHNICAL FIELD OF THE INVENTION

The invention relates to the fabrication of integrated circuits, and more particularly to direct-write semiconductor lithographic techniques.

BACKGROUND OF THE INVENTION

It is well established in the semiconductor industry that production of smaller features on integrated circuits is highly desirable. Market trends in integrated-circuit based electronic equipment are towards smaller, faster, lighter equipment with ever greater levels of function. In an effort to build faster and more powerful computer hardware, engineers are steadily seeking to shrink the size of circuit elements and data storage devices. With conventional optical lithographic techniques, there are some inherent limits on how narrow (or fine) a line (or feature) can be laid out and fabricated in a semiconductor device. A similar problem is evident with regard to inspecting semiconductor circuit elements for flaws, which demands a resolution generally at least 10 times (one order of magnitude) finer than the smallest element.

Photolithography is a common technique employed in the manufacture of semiconductor devices. Typically, a semiconductor wafer is coated with a layer of light sensitive resist material (photoresist). Using a patterned mask or reticle, the wafer is exposed to projected light from an illumination source, typically actinic light, which manifests a photochemical effect on the photoresist, which is ultimately (typically) chemically etched away, leaving a pattern of photoresist "lines" on the wafer corresponding to the pattern on the mask or reticle. The patterned photoresist on the wafer is also referred to as a mask, and the pattern in the photoresist mask replicates the pattern on the image mask (or reticle).

In current photolithographic apparatus, light having at least a substantial visible content is typically employed. Visible light has a frequency on the order of $10^{15}$ Hz (Hertz), and a wavelength on the order of $10^{-6}$–$10^{-7}$ meters. The following terms are well established: 1 µm (micrometer) is $10^{-6}$ meters; 1 nm (nanometer) is $10^{-9}$ meters; and 1 Å (Angstrom) is $10^{-10}$ meters.

Among the problems encountered in photolithography are nonuniformity of source illumination and point-to-point reflectivity variations of photoresist films. Both of these features of current photolithography impose undesirable constraints on further miniaturization of integrated circuits. Small and uniformly sized features are, quite evidently, the object of prolonged endeavor in the field of integrated circuit design. Generally, smaller is faster, and the smaller the features that can be reliably fabricated, the more complex the integrated circuit can be.

With regard to uniformity of source illumination, attention is directed to commonly-owned U.S. Pat. No. 5,055,871, issued to Pasch. As noted in that patent, non-uniformities in the illuminating source will result in non-uniformities of critical dimensions (cd) of features (e.g., lines) formed on the semiconductor device, and the illumination uniformity if photolithographic apparatus will often set a limit to how small a feature can be formed. There usually being a small "error budget" associated with any integrated circuit design, even small variations in illumination intensity can be anathema to the design goals.

With regard to reflectivity of photoresist films, it has been observed that minor thickness variations in a photoresist film will cause pronounced local variations in how efficiently the illuminating light is absorbed (actinically) by the photoresist film, which consequently can adversely affect the uniformity of critical dimensions (cd) of features (such as polysilicon lines or gates) sought to be formed in a layer underlying the photoresist. This problem is addressed in commonly-owned, copending U.S. patent application No. 07/906,902, filed Jun. 29, 1992 by Michael D. Rostoker, which discusses techniques for applying a substantially uniform thickness layer of photoresist, and which is incorporated by reference herein.

Another, more serious problem with photolithography is one of its inherent resolution. The cd's of the smallest features of today's densest integrated circuits are already at sub-micron level (a "micron" or "µm" is one millionth of a meter). Such features are only slightly larger than a single wavelength of visible light, severely pushing the limits of the ability of visible light techniques to resolve those features. As integrated circuit features become smaller, the demand for more nearly "perfect" optical components increases. At some point, however, such optics become impractical and inordinately expensive, or even impossible to produce. Although the resolving power of light, vis-a-vis submicron semiconductor features is being stretched to its limit, the ability to etch (wet, dry, chemical, plasma) features on a semiconductor wafer is not limited by wavelength.

As the limits of conventional focusing optics have been pushed out of the realm of usefulness for photo-lithography, techniques such as e-beam (electron-beam) lithography have surfaced. Focusing an electron beam requires a different type of "optics", generally involving electromagnetic and/or electrostatic fields to effect focusing and deflection of the beam. Further, the nature of e-beam lithography is such that it can only be carried out in a vacuum.

In a general sense, dealing with objects smaller than the wavelengths of visible light is becoming more and more common in contemporary science and technology. For example, with regard to the issue of inspectability, there has appeared a family of new microscopes capable of mapping atomic and molecular shapes, electrical, magnetic and mechanical properties, and temperature variations at a higher resolution than ever before, without the need to modify the specimen or expose it to damaging, high-energy radiation. These microscopes are known as scanned-probe microscopes, and are typified by the scanning-tunneling microscope (STM). The STM is relatively small and inexpensive, compared to other high-resolution microscopes, but provides unprecedented resolution and accuracy. For example, the topology of a surface can be detected, down to the atomic level in some instances. In an extension of the STM technology, STM equipment has been demonstrated to be capable of manipulating (picking and placing) individual atoms on a surface of a substrate.

High-resolution imaging, however, presents an altogether different problem. Short-wavelength lithographic techniques, such as ultraviolet and X-ray lithography, have been proposed and/or are in use. These techniques overcome the visible light resolution barrier, but exhibit difficulties of their own, not the least of which are expense, difficulty to control, cumbersome processing environments, unpredictable radiation source characteristics (i.e., poor source "fluency"), etc..

As used herein, the term "lithography" refers to the process whereby a pattern of lines and the like is formed within a layer of a material (e.g., photoresist) on a semiconductor device. The pattern, which represents 'converted' material surrounded by 'unconverted' material (or vice-versa) is used, in subsequent processing steps, to form corresponding structures in an underlying layer (e.g., polysilicon) on the semiconductor device. As mentioned above, techniques such as ultraviolet and X-ray lithography hold promise for forming finer features (i.e., finer patterns, hence smaller structures) in semiconductor devices. Given the object of forming ever finer features, what is needed are even higher resolution techniques for forming even finer patterns in a layer on a semiconductor device. As used herein, "direct-write lithography" refers to creating such patterns directly in the layer, without the intermediary of an imaging mask such as is used in conventional photolithography.

DISCLOSURE OF THE INVENTION

It is therefore an object of the present invention to provide an improved, high-resolution semiconductor lithographic technique.

It is a further object of the present invention to provide an inexpensive semiconductor lithographic technique.

It is a further object of the present invention to provide an electron-beam or electron-field semiconductor lithographic technique which does not require focusing electron "optics" or electron beam deflection "optics".

According to the invention, high-resolution, direct-write, electron-beam semiconductor lithography is accomplished by providing a positioning mechanism and needle-like probe similar to those used in scanning-tunneling microscopy, and placing a semiconductor wafer on a wafer positioning stage under the probe. The wafer and probe are moved relative to one another, and an electron field emission source provides energy for an electron beam operating in a near-field afocal mode to pass from the probe to the semiconductor wafer. The semiconductor wafer is coated with an electron-beam sensitive resist, such as those used in conventional e-beam lithography.

In one embodiment, a wafer positioning stage with a wafer-receiving area is provided, and a needle-like probe is positioned above the wafer receiving area. The probe has a tip facing (aimed at) the wafer receiving area. Means are provided for controlling the distance between the probe tip and a semiconductor wafer in the wafer receiving area. Means are also provided for controlling the position of a semiconductor wafer on the wafer positioning stage such that any point on the surface of the wafer can be positioned immediately under the probe tip. An electron field emission source is connected to the probe. The source is used to generate an electron beam between the probe tip and the surface of the wafer. The source is controllable to effect changes in the electron beam current so that selective exposure of a resist on a semiconductor wafer can be accomplished. Higher currents expose the resist while lower currents do not.

According to an aspect of the invention, means are provided for monitoring the electron beam current.

According to another aspect of the invention, means are provided for effecting a rapid x-y scan of the probe tip in an x-y plane perpendicular to the distance between the probe tip and the semiconductor wafer (parallel to the plane of the wafer).

According to another aspect of the invention, the probe tip scanning mechanism is provided by piezoelectric positioners.

Other aspects of the invention are directed to multi-probe embodiments having separately controllable electron field emission sources for each probe.

According to an aspect of the multi-probe variation, the probes may be scanned either independently or in tandem (in gangs).

Other embodiments of the invention are directed to corresponding methods of performing semiconductor lithography using the inventive techniques described hereinabove.

According to an aspect of the invention, probe current may be monitored, in a fashion similar to that used in scanning-tunneling microscopy, to determine the appearance and nature of the surface of the semiconductor wafer, thereby providing evidence of the location of underlying features. These feature locations can be used as positional references to assist in aligning exposure patterns to the existing structures in the wafer.

The probe tips are maintained at a distance of less than 2 microns (preferably less than 500 Angstroms) from the surface of the wafer, and provide an afocal electron beam spot well suited to (small enough for) present and future lithographic needs.

The present inventive techniques use simple, inexpensive techniques for positioning and exposing, and use known resist compounds. The exposure mechanism operates in a near-field afocal mode, without focusing optics. The multi-probe embodiments provide for improved throughput by permitting exposure of more than one wafer site at a time.

Other objects, features, and advantages of the present invention will become apparent in light of the following description thereof.

DETAILED DESCRIPTION OF THE INVENTION

Figure 1A:
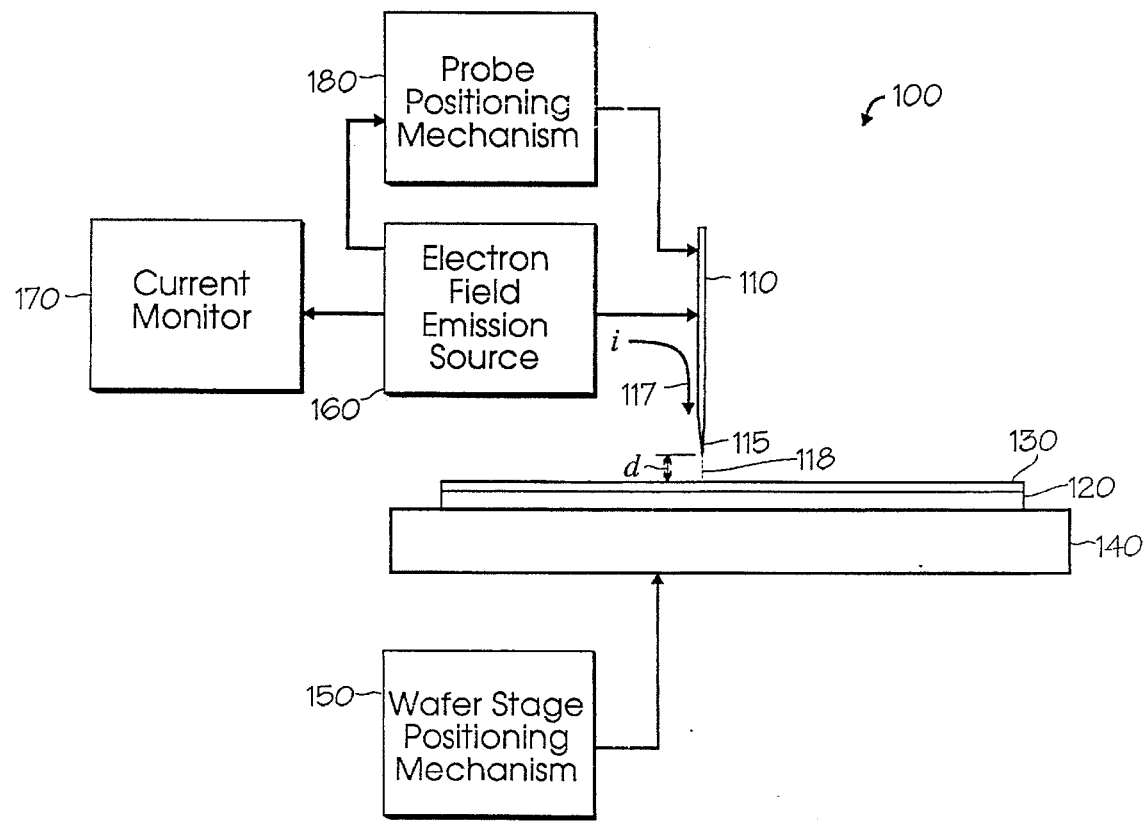
FIG. 1a is a block diagram of a direct-write electron-beam lithographic technique, according to the invention.

According to the invention, a device similar to a scanning-tunneling microscope (STM) is adapted to provide very high resolution direct-write electron-beam semiconductor lithography. While the basic apparatus of the STM is well known to those of ordinary skill in the art, a description is provided hereinbelow to facilitate description of the inventive technique relative thereto.

The scanning tunneling microscope, for which Gerd Binnig and Heinrich Rohrer of the IBM Zurich Research Laboratory received a Nobel prize in 1986, overcame a well-known wavelength-based limit of microscope resolution known as the Abbe barrier using a technique first described in 1956 by J. A. O'Keefe, then of the U.S. Army Mapping Service. O'Keefe proposed a microscope in which light would shine through a tiny hole in an opaque screen, illuminating an object directly in front of the screen. Light transmitted through the specimen or reflected back through the hole would be recorded as the sample was scanned back and forth. O'Keefe pointed out that the resolution of such a "scanning near-field microscope" would be limited only by the size of the hole and not by the wavelength of the light. In principle the device could make super-resolving images (images showing details smaller than half a wavelength).

O'Keefe's technique did not have the benefit of modern high-resolution positioning mechanisms. By resorting to long-wavelength radiation, however, the technique was demonstrated in 1972 by Eric Ash of University College, London, who passed microwave radiation at a wavelength of three centimeters through a pinhole-size aperture and scanned an object in front of it to record an image with a resolution of 150 microns (one two-hundredth of a wavelength).

Suitable means for ultra-fine position control are now available in the form of piezoelectrics (ceramic materials that change size ever so slightly when an electrical potential across the material is changed). Piezoelectric controls facilitated the development, in 1981, of a scanning near-field microscope, the scanning tunneling microscope, or STM.

In the STM the "aperture" is a tiny tungsten probe, the tip of which is (typically ground) so fine that it may consist of only a single atom and measure just 0.2 nanometer in width. Piezoelectric positioning devices maneuver the tip to within a nanometer or two of the surface of a specimen under examination—close enough that the electron clouds of the atom at the probe tip and of the nearest atom of the specimen overlap. When a small voltage is applied to the tip, electrons "tunnel" across the gap, from the probe tip to the specimen, allowing a minuscule tunneling current to pass therebetween. The strength of the current is extremely sensitive to the width of the gap; typically it decreases by a factor of 10 each time the gap is widened by 0.1 nanometer (e.g., half the diameter of an atom).

X- and Y-axis piezoelectric controls (which govern motion in the two dimensions of a plane) move the probe back and forth across the specimen surface in a raster (or other suitable) pattern, its parallel tracks separated by perhaps a fraction of a nanometer. If the probe is maintained a steady height, vis-a-vis the surface of the specimen being measured, the tunneling current fluctuates dramatically, increasing as the tip passes over 'bumps' such as the 'surfaces' of individual atoms and dramatically decreasing (e.g., to zero) as the probe tip traverses depressed areas between the topological features of individual atoms. More effectively, for the purpose of measuring the topology of the surface of the specimen being measured, the probe is moved up and down (z-axis) in concert with the topography. A feedback mechanism senses variations in the tunneling current and varies the voltage applied to a third, z-axis control. The z-axis piezoelectric positioning mechanism moves the probe vertically to stabilize the current and maintain a constant gap between the probe tip and the surface of the specimen being measured.

The variations in the voltage applied to the z-axis positioning device (e.g., piezoelectric) are electronically translated into an image of surface relief (topology). If the sharpness of the probe, the precision of the controls and the fineness of the raster scan are all sufficient, STM images can reveal individual atoms, as small as 0.2 nanometer in diameter. The images are super-resolving: the quantum-mechanical wavelength of the tunneling electrons in the probe (the "radiation" that gives rise to the image) being approximately one nanometer.

It should be noted that the "images" so created are not topology (topography) maps in the usual sense, but rather are images of constant tunneling probability of the specimen surface. The tunneling probability is affected by topography, but it is also affected by variations in the abundance and energies of surface electrons. When the specimen is composed of just a single element, tunneling probability closely follows topography, but "topography" can also reveal atom-by-atom variations in composition. A contaminant atom on an otherwise uniform surface, for example, may appear as an anomalous pit or bump, depending on its electronic properties.

Scanning-tunneling microscopy has advanced to a point where if characteristics of the surface are sufficiently well known, it is relatively simple to differentiate between topographic changes and compositional changes, providing information not only about the appearance of the specimen surface, but of its nature, as well.

In 1985, Binnig, Calvin F. Quate (of Stanford University) and Christoph Gerber (of IBM Zurich), introduced the atomic force microscope (AFM), an offshoot of the STM which moves a minute probe tip (in this case, an atomically sharp shard of diamond mounted on a strip of metal foil) over the specimen in a raster pattern. In place of tunneling current, the AFM records contours of force (the repulsion generated by the overlap of the electron cloud at the tip with the electron clouds of surface atoms). In effect the tip, like the stylus of a phonograph, "reads" the surface. The foil acts as a spring, keeping the tip pressed against the surface as it is jostled up and down by the atomic topography.

For some time, the scanning electron microscope (SEM) has been a standard tool in microelectronics: it can resolve details as small as a few nanometers. Yet the SEM requires that the specimen be coated with metal and imaged in a vacuum, and it has poor three-dimensional resolution. Moreover, its high-energy electrons can damage or destroy a semiconductor device, which limits the SEM's value for monitoring production quality. Scanned-probe microscopes (STMs, AFMs) address these needs.

According to the invention, by providing a structure similar to the scanning-tunneling microscope in conjunction with a controllable electron emission source, and using a semiconductor wafer coated with a layer of electron-beam sensitive resist material, ultra-high resolution direct-write electron-beam semiconductor lithography can be effected.

Further, according to the invention, this technique can be used with resist materials which are substantially planar in structure. Said planarized structures can be single level, or multi-level. Said resist structures can be made with organic materials typically used for electron beam exposure, or can be inorganic materials (e.g., silicon-germinides) which have significant sensitivity to electron beam exposure.

FIG. 1a is a block diagram of a direct-write lithographic apparatus 100 embodying the inventive technique. A needle-like probe 110 with an extremely sharp point 115 is positioned immediately above a semiconductor wafer 120. The probe 110 is made of e.g., tungsten, and is similar to and formed in the same manner as the needle like probes used for STM's (Scanning Tunnelling Microscopes). (Depending upon the degree of lithographic resolution desired, the probe tip need not necessarily be ground as fine as that required for scanning tunneling microscopy. This is especially true for lower resolutions.) The surface of the semiconductor wafer is coated with a thin layer of a resist material 130. The resist material 130 is chemically sensitive to exposure to an electron beam, and may be any of the organic resist materials known and used in conventional e-beam semiconductor lithography, or may be any inorganic material (e.g., a silicon germinide) which has a significant sensitivity to electron beam exposure. The coated wafer 120 is mounted to a movable wafer stage 40. The position of the wafer stage 140 is controlled by a wafer-stage positioning mechanism 150. The wafer stage 140 and positioning mechanism 150 are essentially identical to those used for conventional e-beam semiconductor lithography.

The probe 110 is affixed to a probe positioning mechanism 180, preferably including a piezoelectric mechanism such as that used to position the probe of an STM. The probe positioning mechanism is capable of moving the probe in at least the vertical direction (i.e., perpendicular to the surface of the wafer 120) and preferably horizontally as well (i.e., perpendicular to the plane of the Figure, as depicted, and left and right across the Figure, as depicted). Preferably, the accuracy of the probe positioning mechanism 180 is such that the probe tip 115 can be positioned to within a few Angstroms ($10^{-10}$ meters) of a desired position. (Such positioning mechanisms are known to those of ordinary skill in the art, and are widely used in scanning-tunneling microscopy and atomic force microscopy.

As is well known to those of ordinary skill in the art, such piezoelectric positioning mechanisms are commonly capable, in addition to controlling the vertical position of the probe tip 115, of effecting a rapid X-Y scanning pattern of the tip 115 over a small portion of the surface of the wafer 120. This enables the use of the wafer stage positioning mechanism 150 as a "coarse" X-Y wafer positioning mechanism, with "fine" X-Y positioning of the probe tip 115 over the surface of the wafer being effected by the scanning action of piezoelectric positioners in the probe positioning mechanism 180.

An electron field emission source 160 (also referred to interchangeably hereinafter as "emission source" and "electron source") provides a source of electrons to the probe 110. The electron field emission source 160 is set preferably in the range of 50–2000 Volts, and is controllable over this range. A current monitor 170 provides a measure of the current 117 ("i") flowing from the emission source through the probe 110 to the wafer 120, under suitable conditions (e.g., vacuum) producing an electron beam 118. By controlling the electron field emission source 160, the electron-beam current 117 flowing through the probe 110 to the wafer 120 can be controlled. Sufficiently small values of electron-beam (e-beam) current 117 will not "expose" or chemically convert the resist material 130, while greater current values will cause the resist material 130 to become chemically converted. By moving (or scanning) the wafer 120 under the tip 115 of the probe 110, and by controlling the electron-beam current 117 through the probe 110 according to the position of the probe over the surface of the wafer 120 (i.e., according to the location of the spot on the wafer 120 below the probe), it is possible to create patterns of chemically converted areas in the resist 130. Subsequent etching removes the unconverted areas of the resist material 130, leaving behind only those areas of the resist 130 which have been chemically converted by sufficient exposure to the electron beam 118.

According to an aspect of the invention, the electron beam current may be controlled either: a) by controlling the electron field emission source 160, or b) by altering the distance from the probe tip 115 to the wafer surface (e.g., via the probe positioning mechanism 180).

According to an aspect of the invention, the wafer 120 may be moved under the probe 110 (by moving the wafer stage 140 via the wafer stage positioning mechanism 150) or the probe 110 and associated mechanical structure may be moved over the surface of the wafer 120. It is also possible to use both types of motion in combination, i.e., moving both the probe 110 and the wafer 120 to achieve a desired relative position therebetween. In either case, three-dimensional control of the position of the probe tip 115 relative to the wafer surface is achieved, permitting high-resolution selective exposure of the resist 130 to the electron beam 118. Varying the electron beam current 117 provides further resist exposure selectivity.

The emission source 160 and probe 110 produce an electron beam 118 which achieves wafer exposure resolution in a near-field afocal mode, and require no focusing electron "optics" (again, in much the same manner as the STM achieves its image resolution). (Compare this with conventional e-beam lithographic equipment which requires elaborate and expensive e-beam focusing "optics"). The probe 110 is maintained preferably at a nominal distance of less than 2.0 μm (microns, or millionths of a meter) from the surface of the wafer 120. For very high resolution semiconductor lithography, the probe 110 may be positioned to less than 500Å (Angstroms) from the surface of the wafer 120. Slight variations in surface topology are accommodated in the same manner as in STM microscopy, i.e., current feedback from the electron field emission source 160 to the probe positioning mechanism 180 is used to adjust the position of the probe tip 115 to follow the contour of the surface of the coated wafer 120.

According to an aspect of the invention, the distance "d" between the wafer 120 and the probe tip 115 can be substantially greater than that used in scanning-tunneling microscopy, but should be sufficiently close that near-field dispersion (diffusion) of the electron beam 118 still produces an electron beam "spot" on the surface of the wafer which is small compared to the desired features to be imaged in the resist 130. In fact, by varying the distance "d" it is possible to vary the effective "spot" size.

According to an aspect of the invention, by monitoring the electron beam current (through the probe 110 via the current monitor 170, e.g., in the manner of scanning-tunneling microscopy) the nature and appearance of the underlying surface may be determined. This is particularly advantageous in aligning exposed areas of resist (the exposed "pattern") to underlying structures in the wafer. This is illustrated with respect to FIG. 1b.

Figure 1B:
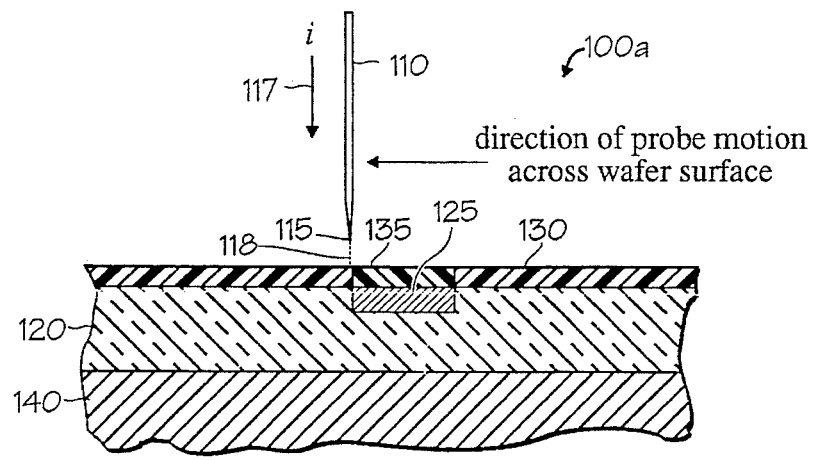
FIG. 1b is a cross-sectional view of a portion of a direct-write electron-beam lithographic apparatus, according to the invention.

FIG. 1b is a cross-sectional view 100a of a portion of the apparatus 100 described hereinabove with respect to FIG. 1a. The Figure shows a cross-section taken through the wafer stage 140 and the wafer 120, and shows the needle-like probe 110 above the wafer 120. The resist coating 130 is shown on the surface of the wafer 120. A structure 125 (e.g., a conductive line, a diffusion region, or other integrated circuit feature) underlies the resist layer 130. As the probe tip 115 is moved or scanned across the surface of the wafer 120, electron beam current 117 through the probe 110 is monitored to determine the nature and appearance of the underlying surface, which can be used to identify the position of the underlying structure 125. This position is then used to synchronize the intended exposure pattern to the underlying structure 125. In FIG. 1b, a chemically converted area 135 of the resist 130 overlies the underlying structure 125. This is accomplished by monitoring the electron beam current 117 as the probe 110 traverses (scans) the surface of the wafer 120 until the position of the desired underlying feature (125) is detected, then scanning the area overlying the feature 125 with increased electron beam current 117 to expose the resist 130, thereby forming the chemically converted area 135 of the resist 130. After exposing the resist 130, the electron beam current 117 is lowered to a non-exposing value and further processing continues. For each "feature" (e.g., 135) to be imaged in the resist 130, the surface of the wafer can be scanned for underlying features (e.g., 125) to be used as positional references. Alternatively, an occasional few underlying features (e.g. 125) can be located in this manner, with multiple resist patterns being exposed at absolute positional offsets from the latest positional references. Exact exposure current values depend upon the materials used and resist characteristics, and may be determined empirically.

According to an aspect of the invention, the electron beam interaction with the wafer surface is such that it is not absolutely necessary that the electron exposure take place under high vacuum, as is required by other types of electron beam systems (e.g., conventional e-beam lithographic apparatus). It is possible to use any of a variety of ambients, from high vacuum to above atmospheric pressure gases, including chemically reactive gases.

Figure 2:
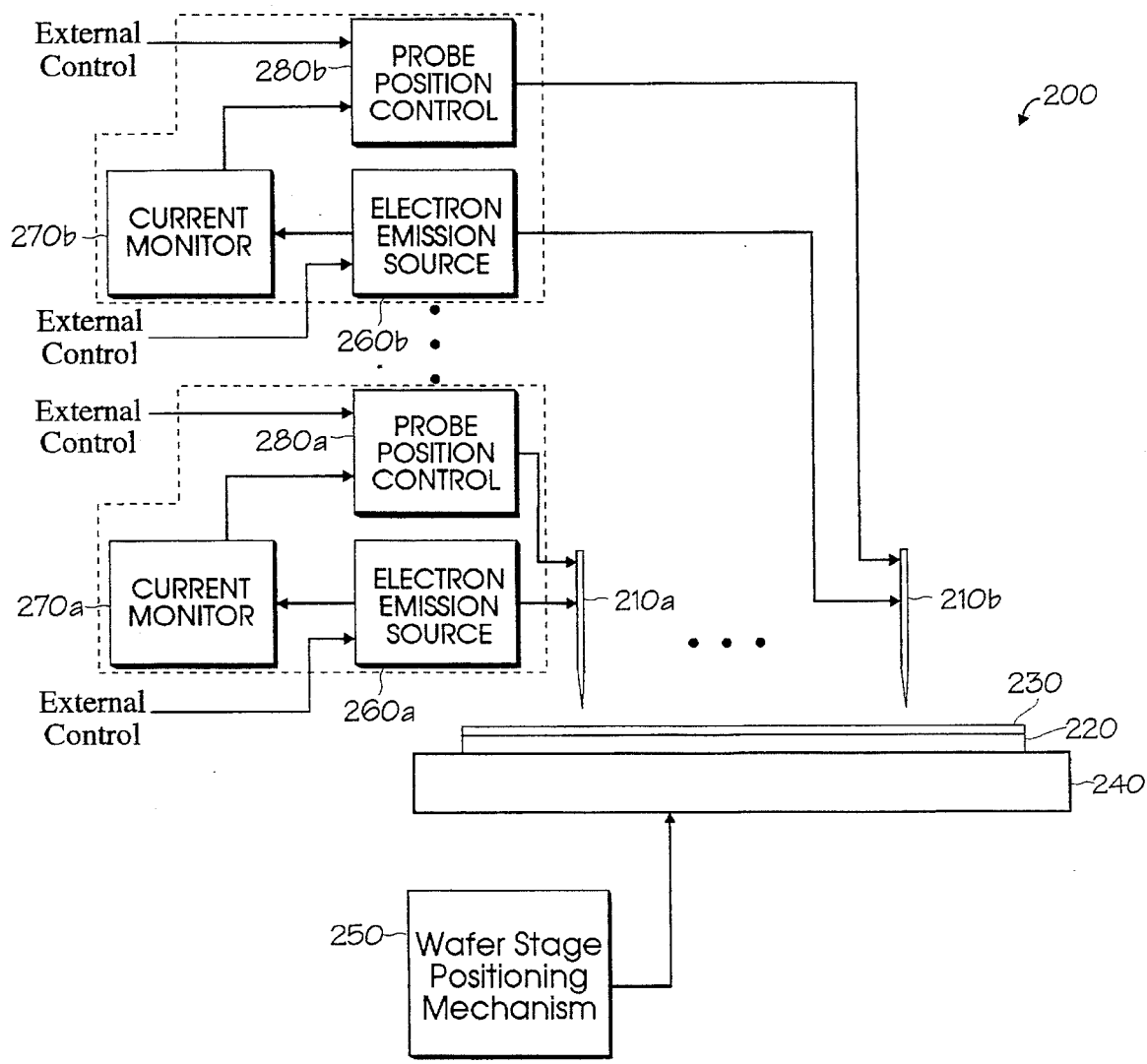
FIG. 2 is a block diagram of a multi-probe variation of the direct-write lithographic apparatus shown in FIG. 1a, according to the invention.

FIG. 2 is a block diagram of a multi-probe variation of the direct-write electron beam lithographic apparatus described hereinabove with respect to FIG. 1a. In contrast to FIG. 1a, however, a plurality of needle-like probes 210a and 210b (two shown) are positioned immediately above a semiconductor wafer 220. The probes are similar in nature and construction to the single probe described as 110 with respect to FIG. 1a. As before, the surface of the semiconductor wafer 220 is coated with a thin layer of a resist material 230. The coated wafer 220 is mounted to a movable wafer stage 240. The position of the wafer stage 240 is controlled by a wafer-stage positioning mechanism 250. The wafer stage 240 and positioning mechanism 250 are essentially identical to those described hereinabove as 140 and 150, respectively, with respect to FIG. 1a.

The probes 210a and 210b are each affixed to a separate probe positioning mechanism 280a and 280b, respectively. The probe positioning mechanisms 280a and 280b are capable of moving their respective probes 210a and 210b in at least the vertical direction (i.e., perpendicular to the surface of the wafer 220) and preferably horizontally as well (i.e., perpendicular to the plane of the Figure, as depicted, and left and right across the Figure, as depicted).

Separate electron field emission sources 260a and 260b provide a source of electrons to the probes 210a and 210b, respectively. As before, the electron field emission sources 260a and 260b are set preferably in the range of 50–2000 Volts, and are controllable over this range. Current monitors 270a and 270b provide a measure of the current flowing through the probes 210a and 210b, respectively. Individual probe currents (electron beam currents) may be controlled via the electron field emission sources 260a and 260b, and/or via the probe position controls 280a and 280b. By moving (or scanning) the wafer 220 under the tips of the probes 210a and 210b, and by controlling the respective electron-beam currents according to the position of the probes 210a and 210b over the surface of the wafer 220, it is possible to create patterns of chemically converted areas in the resist 230 of several areas of the wafer surface at once, thereby significantly improving the productivity of the direct-write lithographic apparatus.

As before, the individual electron beam currents through the probes 210a and 210b may be monitored to determine the nature and appearance of the underlying surface and to synchronize (align) the exposure pattern thereto.

It is possible and desirable to provide various aspects of the probe positioning controls in common. For example, each probe may be provided with a separate vertical (Z-axis) positioner (e.g. a piezoelectric crystal) while some or all of the probes are mounted to a common horizontal (X and Y axis) positioner so that they are scanned in concert over the surface of the wafer. This reduces complexity and expense and facilitates computer coordination of the exposure of the wafer. Further, vertical (Z-axis) positioning means may be provided to groups of probes so that they are raised or lowered in "gangs" as desired. These "gang-oriented" positioning schemes facilitate replication of patterns on multiple areas of the wafer.

It is within the spirit and scope of the present invention that the techniques described hereinabove may be used alone or in combination. For example, the technique described with respect to FIG. 1b for locating underlying features in a semiconductor wafer and using the location as an alignment reference for exposing the resist may also be applied to the multi-probe variations described with respect to FIG. 2.

What is claimed is:

1. A method of effecting direct-write electron-beam semiconductor lithography on a semiconductor wafer, comprising:

disposing a semiconductor wafer on a surface of a wafer-receiving stage;

disposing a layer of electron-beam-sensitive resist over a surface of the semiconductor wafer;

positioning a probe above the surface of the wafer, probe having a tip facing the surface of the wafer;

connecting an electron field emission source to the probe and generating therewith an electron beam having an associated electron beam current from the probe to the semiconductor wafer in an ambient comprising a chemically reactive gas;

controlling a distance between the probe tip and the semiconductor wafer to a selected distance value;

controlling the relative position of the semiconductor wafer and the probe tip so that selected points on the surface of the semiconductor wafer are directly under the probe tip; and controlling the electron beam current to effect electron beam exposure of the resist overlying the selected points on the surface of the wafer.

2. A method according to claim 1, further comprising:

monitoring the electron beam current to determine a location of a structure underlying the resist layer;

using said determined location as a positional reference; and defining the selected points on the surface of the wafer relative to the positional reference.

3. A method according to claim 1, further comprising:

scanning the probe tip over a portion of the surface of the wafer and controlling the electron beam current while scanning to expose selected portions of the resist layer.

4. A method according to claim 3, wherein:

moving the probe tip with piezoelectric positioners.

5. A method according to claim 1, further comprising maintaining said ambient of a chemically reactive gas above atmospheric pressure.

6. A method of effecting direct-write electron-beam semiconductor lithography on a semiconductor wafer, comprising:

forming a layer of electron-beam-sensitive resist over a surface of the semiconductor wafer;

positioning a plurality of probes above the surface of the wafer, said probes being ganged together for integral relative movement parallel to the surface of the wafer and having tips facing the surface of the wafer respectively;

connecting electron field emission sources to said probes and generating therewith electron beams having associated electron beam currents from the probe tips to the semiconductor wafer respectively;

causing integral relative movement of said probes parallel to the surface of the wafer in a predetermined pattern; and controlling the electron beam currents to effect electron beam exposure of the resist underlying said probe tips to form substantially identical resist patterns in the resist respectively.

7. A method according to claim 6, further comprising maintaining the surface of the semiconductor wafer and said probe tips in an ambient comprising a chemically reactive gas.

8. A method according to claim 7, further comprising maintaining said ambient of a chemically reactive gas above atmospheric pressure.

9. A method according to claim 6, further comprising maintaining distances from said probe tips to the semiconductor wafer at a selected distance value.

10. A method according to claim 6, further comprising:

monitoring one of the electron beam currents to determine a location of a structure underlying the resist layer;

using the determined location as a positional reference; and causing the integral relative movement of said probes parallel to the surface of the wafer in the predetermined pattern as referenced to the positional reference.

* * * * *